(12) United States Patent
Liu

(10) Patent No.: US 11,825,677 B2
(45) Date of Patent: Nov. 21, 2023

(54) DISPLAY SUBSTRATE, METHOD OF MANUFACTURING THE SAME, DISPLAY APPARATUS, AND MASK

(71) Applicant: BOE TECHNOLOGY GROUP CO., LTD., Beijing (CN)

(72) Inventor: Yue Liu, Beijing (CN)

(73) Assignee: Boe Technology Group Co., LTD., Beijing (CN)

( * ) Notice: Subject to any disclaimer, the term of this patent is extended or adjusted under 35 U.S.C. 154(b) by 268 days.

(21) Appl. No.: 17/420,011

(22) PCT Filed: Sep. 27, 2020

(86) PCT No.: PCT/CN2020/118125
§ 371 (c)(1),
(2) Date: Jun. 30, 2021

(87) PCT Pub. No.: WO2021/057973
PCT Pub. Date: Apr. 1, 2021

(65) Prior Publication Data
US 2022/0093892 A1 Mar. 24, 2022

(30) Foreign Application Priority Data
Sep. 29, 2019 (CN) .......................... 201910934187.5

(51) Int. Cl.
*H01L 51/52* (2006.01)
*H01L 51/00* (2006.01)
(Continued)

(52) U.S. Cl.
CPC ......... *H10K 50/822* (2023.02); *H10K 50/813* (2023.02); *H10K 59/121* (2023.02);
(Continued)

(58) Field of Classification Search
CPC ............... H10K 50/813; H10K 50/822; H10K 59/35–353; H10K 59/80521; H10K 59/80515
See application file for complete search history.

(56) References Cited

U.S. PATENT DOCUMENTS

2006/0214152 A1 9/2006 Seo et al.
2011/0220899 A1* 9/2011 Park ..................... H10K 71/621
438/34
(Continued)

FOREIGN PATENT DOCUMENTS

| CN | 103346271 A | 10/2013 |
| CN | 103898441 A | 7/2014 |

(Continued)

OTHER PUBLICATIONS

Machine translation, Huo, Chinese Pat. Pub. No. CN105679805A, translation date: May 11, 2023, Espacenet, all pages. (Year: 2023).*
(Continued)

*Primary Examiner* — Victoria K. Hall
(74) *Attorney, Agent, or Firm* — IP & T GROUP LLP

(57) ABSTRACT

A display substrate has a plurality of sub-pixel regions used to display images and a non-sub-pixel region surrounding the sub-pixel regions. The display substrate includes a light-emitting device layer. The light-emitting device layer includes a first electrode layer. The first electrode includes a plurality of first electrodes electrically connected to each other and at least one hollowed-out region among part of adjacent first electrodes. The at least one hollowed-out region is located in the non-sub-pixel region.

18 Claims, 5 Drawing Sheets

(51) Int. Cl.
  *H01L 27/32* (2006.01)
  *H01L 51/56* (2006.01)
  *H10K 50/822* (2023.01)
  *H10K 50/813* (2023.01)
  *H10K 59/35* (2023.01)
  *H10K 71/00* (2023.01)
  *H10K 71/60* (2023.01)
  *H10K 59/121* (2023.01)
  *H10K 59/60* (2023.01)
  *H10K 59/122* (2023.01)
  *H10K 102/00* (2023.01)

(52) U.S. Cl.
  CPC .......... *H10K 59/35* (2023.02); *H10K 59/352* (2023.02); *H10K 59/353* (2023.02); *H10K 71/00* (2023.02); *H10K 71/60* (2023.02); *H10K 59/122* (2023.02); *H10K 59/60* (2023.02); *H10K 2102/3026* (2023.02)

(56) References Cited

U.S. PATENT DOCUMENTS

| | | | | |
|---|---|---|---|---|
| 2014/0242737 A1* | 8/2014 | Chung | ................... | H10K 71/00 118/504 |
| 2015/0014639 A1* | 1/2015 | Chung | ................ | H10K 50/822 257/40 |
| 2015/0303399 A1 | 10/2015 | Cui et al. | | |
| 2016/0322595 A1* | 11/2016 | Choi | ................... | H10K 59/352 |
| 2017/0053971 A1 | 2/2017 | Sato | | |
| 2017/0092894 A1 | 3/2017 | Yang et al. | | |
| 2017/0330923 A1 | 11/2017 | Chung et al. | | |
| 2020/0258947 A1* | 8/2020 | Chung | ................ | H10K 50/824 |
| 2020/0381489 A1* | 12/2020 | Hwang | ................ | H10K 59/353 |
| 2020/0411605 A1* | 12/2020 | Moon | ................... | H10K 50/822 |
| 2021/0005687 A1* | 1/2021 | Jeon | ....................... | H10K 59/35 |
| 2021/0020704 A1* | 1/2021 | Kim | ..................... | H10K 59/123 |
| 2021/0028248 A1* | 1/2021 | Kim | ..................... | C23C 14/042 |

FOREIGN PATENT DOCUMENTS

| | | | | | |
|---|---|---|---|---|---|
| CN | 103898441 A | * | 7/2014 | ............. | C23C 14/04 |
| CN | 104362170 A | | 2/2015 | | |
| CN | 105679805 A | | 6/2016 | | |
| CN | 105679805 A | * | 6/2016 | ........... | G06F 3/0412 |
| CN | 106469747 A | | 3/2017 | | |
| CN | 106876425 A | | 6/2017 | | |
| CN | 107394061 A | | 11/2017 | | |
| CN | 107464831 A | * | 12/2017 | ........... | H10K 59/353 |
| CN | 107464831 A | | 12/2017 | | |
| CN | 108258024 A | * | 7/2018 | ......... | G06V 40/1318 |
| CN | 108258024 A | | 7/2018 | | |
| CN | 108565354 A | | 9/2018 | | |
| CN | 108565354 A | * | 9/2018 | ............. | H10K 50/81 |
| CN | 109950284 A | * | 6/2019 | ........... | H10K 59/352 |
| CN | 109950284 A | | 6/2019 | | |
| CN | 110098224 A | * | 8/2019 | ........... | G06V 10/147 |
| CN | 110098224 A | | 8/2019 | | |
| CN | 110649179 A | | 1/2020 | | |

OTHER PUBLICATIONS

Machine translation, Chen, Chinese Pat. Pub. No. CN107464831A, translation date: May 11, 2023, Espacenet, all pages. (Year: 2023).*
Machine translation, Han, Chinese Pat. Pub. No. CN109950284A, translation date: May 11, 2023, Espacenet, all pages. (Year: 2023).*
Machine translation, Yang, Chinese Pat. Pub. No. CN110098224A, translation date: May 11, 2023, Espacenet, all pages. (Year: 2023).*
Machine translation, Zuo, Chinese Pat. Pub. No. CN108565354A, translation date: May 11, 2023, Espacenet, all pages. (Year: 2023).*
Machine translation, Wei, Chinese Pat. Pub. No. CN103898441A, translation date: May 11, 2023, Espacenet, all pages. (Year: 2023).*
Machine translation, Zeng, Chinese Pat. Pub. No. CN108258024A, translation date: May 11, 2023, Espacenet, all pages. (Year: 2023).*
Translation, Written Opinion of the International Searching Authority, International Searching Authority, International application No. PCT/CN2020/118125, dated Dec. 30, 2020, all pages. (Year: 2020).*
Translation, International Search Report, International Searching Authority, International application No. PCT/CN2020/118125, dated Dec. 30, 2020, all pages. (Year: 2020).*
First Office Action of priority application No. CN 201910934187.5 issued by the China Patent Office dated Apr. 6, 2021.
Second Office Action of priority application No. CN 201910934187.5 issued by the China Patent Office dated Sep. 18, 2021.

* cited by examiner

DISPLAY SUBSTRATE, METHOD OF MANUFACTURING THE SAME, DISPLAY APPARATUS, AND MASK

CROSS-REFERENCE TO RELATED APPLICATIONS

This application is a national phase entry under 35 USC 371 of International Patent Application No. PCT/CN2020/118125 filed on Sep. 27, 2020, which claims priority to Chinese Patent Application No. 201910934187.5, filed Sep. 29, 2019, which are incorporated herein by reference in their entirety.

TECHNICAL FIELD

The embodiments of the present disclosure relates to display technologies, and in particular, to a display substrate, a method of manufacturing the same, a display apparatus, and a mask.

BACKGROUND

With the popularization of display products such as smart phones, users have higher and higher requirements for the functions of a smart product such as a mobile phone.

SUMMARY

Embodiments of the present disclosure provide a display substrate having a plurality of sub-pixel regions used to display images and a non-sub-pixel region surrounding the sub-pixel regions. The display substrate includes: a light-emitting device layer. The light-emitting device layer includes a first electrode layer that includes a plurality of first electrodes electrically connected to each other and at least one hollowed-out region among part of adjacent first electrodes. The at least one hollowed-out region is located in the non-sub-pixel region.

In some embodiments of the present disclosure, the light-emitting device layer further includes a second electrode layer stacked with the first electrode layer, and the second electrode layer includes a plurality of second electrodes spaced apart from each other. A region among at least part of adjacent second electrodes overlaps with the at least one hollowed-out region.

In some embodiments of the present disclosure, the plurality of sub-pixel regions include a plurality of rows of sub-pixel regions, and the plurality of rows of sub-pixel regions include a plurality of first color sub-pixel regions, a plurality of second color sub-pixel regions, and a plurality of third color sub-pixel regions. Each odd-numbered row of sub-pixel regions includes first color sub-pixel regions and second color sub-pixel regions, each even-numbered row of sub-pixel regions includes third color sub-pixel regions, and first electrodes corresponding to the third color sub-pixel regions in each even-numbered row of the sub-pixel regions are arranged alternately with hollowed-out regions along a row direction; or, each even-numbered row of sub-pixel regions includes the first color sub-pixel regions and the second color sub-pixel regions, each odd-numbered row of sub-pixel regions includes the third color sub-pixel regions, and the first electrodes corresponding to the third color sub-pixel regions in each odd-numbered row of the sub-pixel regions are arranged alternately with hollowed-out regions along the row direction.

In some embodiments of the present disclosure, the plurality of first electrodes are in one-to-one correspondence with the plurality of sub-pixel regions. Along the row direction, the third color sub-pixel regions are staggered from the first color sub-pixel regions and the second color sub-pixel regions, and first electrodes corresponding to the third color sub-pixel regions are staggered from first electrodes corresponding to the first color sub-pixel regions and first electrodes corresponding to the second color sub-pixel regions. Adjacent first electrodes in the first electrodes corresponding to the first color sub-pixel regions and the first electrodes corresponding to the second color sub-pixel regions in each odd-numbered row of sub-pixel regions are in direct contact, and are directly connected to the first electrodes, which are corresponding to the third color sub-pixel regions, located between the adjacent first electrodes in the row direction and adjacent to the adjacent first electrodes in a column direction; or, adjacent first electrodes in the first electrodes corresponding to the first color sub-pixel regions and the first electrodes corresponding to the second color sub-pixel regions in each even-numbered row of sub-pixel regions are in direct contact, and are directly connected to the first electrodes, which are corresponding to the third color sub-pixel regions, located between the adjacent first electrodes in the row direction and adjacent to the adjacent first electrodes in a column direction.

In some embodiments of the present disclosure, a first color sub-pixel region is a blue sub-pixel region, a second color sub-pixel region is a red sub-pixel region, and a third color sub-pixel region is a green sub-pixel region.

In some embodiments of the present disclosure, a shape of a first electrode corresponding to a first color sub-pixel region is same as a shape of a first electrode corresponding to a second color sub-pixel region. An area of the first electrode corresponding to the first color sub-pixel region is same as an area of the first electrode corresponding to the second color sub-pixel region.

In some embodiments of the present disclosure, a shape of a first electrode corresponding to a third color sub-pixel region is same as the shape of the first electrode corresponding to the first color sub-pixel region. An area of the first electrode corresponding to the third color sub-pixel region is same as the area of the first electrode corresponding to the first color sub-pixel region.

In some embodiments of the present disclosure, the plurality of sub-pixel regions are arranged in an array.

In some embodiments of the present disclosure, the plurality of first electrodes are in one-to-one correspondence with the plurality of sub-pixel regions. There are M columns of sub-pixel regions. In a row direction, at least part of adjacent first electrodes are in direct contact. In a column direction, at least part of adjacent first electrodes in the X-th column are in direct contact. X is greater than or equal to 1, and less than or equal to M ($1 \leq X \leq M$), and X and M are both positive integers.

In some embodiments of the present disclosure, at least part of adjacent first electrodes overlap in the non-sub-pixel region.

In some embodiments of the present disclosure, the plurality of first electrodes are in one-to-one correspondence with the plurality of sub-pixel regions. An edge of a first electrode extends beyond an edge of a sub-pixel region corresponding to the first electrode, and distances from the edge of the first electrode to the edge of the sub-pixel region are equal everywhere.

The embodiments of the present disclosure further provide a display apparatus that includes the display substrate according to any one of the embodiments.

In some embodiments of the present disclosure, the display apparatus further includes a collection portion disposed on a side away from a light-emitting side of the light-emitting device layer. An orthogonal projection of the collection portion on a plane in which the display substrate is located is within an orthogonal projection of a hollowed-out region among adjacent first electrodes on the plane in which the display substrate is located.

In some embodiments of the present disclosure, the light-emitting device layer further includes a second electrode layer stacked with the first electrode layer, and the second electrode layer includes a plurality of second electrodes spaced apart from each other. A region among at least part of adjacent second electrodes overlaps with the at least one hollowed-out region. The orthogonal projection of the collection portion on the plane in which the display substrate is located is within an overlapping region between an orthogonal projection of the region among at least part of adjacent second electrodes on the plane in which the display substrate is located and an orthogonal projection of a hollowed-out region on the plane in which the display substrate is located, so as to receive a collection signal from a light-emitting side of the display apparatus.

In some embodiments of the present disclosure, the collection portion includes at least one of a camera, a finger-print reader, or a vital-sign collector.

The embodiments of the present disclosure further provide a method of manufacturing the display substrate. The display substrate has a plurality of sub-pixel regions and a non-sub-pixel region surrounding the sub-pixel regions. The method of manufacturing the display substrate includes forming a first electrode layer on a base by a mask. The first electrode layer includes a plurality of first electrodes electrically connected to each other and at least one hollowed-out region among part of adjacent first electrodes, and the at least one hollowed-out region is located in the non-sub-pixel region.

In some embodiments of the present disclosure, the plurality of sub-pixel regions include a plurality of rows of sub-pixel regions, and the plurality of rows of sub-pixel regions include a plurality of first color sub-pixel regions, a plurality of second color sub-pixel regions, and a plurality of third color sub-pixel regions. Each odd-numbered row of sub-pixel regions includes first color sub-pixel regions and second color sub-pixel regions, each even-numbered row of sub-pixel regions includes third color sub-pixel regions, and first electrodes corresponding to the third color sub-pixel regions in each even-numbered row of the sub-pixel regions are arranged alternately with hollowed-out regions along a row direction; or, each even-numbered row of sub-pixel regions includes the first color sub-pixel regions and the second color sub-pixel regions, each odd-numbered row of sub-pixel regions includes the third color sub-pixel regions, and the first electrodes corresponding to the third color sub-pixel regions in each odd-numbered row of the sub-pixel regions are arranged alternately with hollowed-out regions along the row direction. The plurality of first electrodes are in one-to-one correspondence with the plurality of sub-pixel regions. The forming the first electrode layer by the mask includes forming the first electrodes corresponding to the first color sub-pixel regions and the first electrodes corresponding to the second color sub-pixel regions by a first sub-mask of the mask.

In some embodiments of the present disclosure, the forming the first electrode layer by the mask further includes forming the first electrodes corresponding to the third color sub-pixel regions by the first sub-mask.

In some embodiments of the present disclosure, the plurality of first electrodes are in one-to-one correspondence with the plurality of sub-pixel regions; the plurality of sub-pixel regions are arranged in an array, and there are M columns of sub-pixel regions. The forming the first electrode layer on the base by the mask includes: in a column direction, forming first electrodes corresponding to X-th column of sub-pixel regions by a second sub-mask of the mask; and in a row direction, forming other first electrodes by a third sub-mask of the mask. In the row direction, at least part of adjacent first electrodes are in direct contact. In the column direction, at least part of adjacent first electrodes located in the X-th column are in direct contact. X is greater than or equal to 1, and less than or equal to M (1≤X≤M), and X and M are both positive integers.

The embodiments of the present disclosure further provide a mask, which is used for manufacturing the first electrode layer in the display substrate according to any one of the embodiments by evaporation.

BRIEF DESCRIPTION OF THE DRAWINGS

In order to describe technical solutions in embodiments of the present disclosure or the prior art more clearly, accompanying drawings to be used in the description of embodiments or the prior art will be introduced below briefly. Obviously, the accompanying drawings to be described below are merely accompanying drawings of some embodiments of the present disclosure, and a person of ordinary skill in the art may obtain other drawings according to these drawings without paying any creative effort.

DETAILED DESCRIPTION

Technical solutions in the embodiments of the present disclosure will be described clearly and completely with reference to the accompanying drawings in the embodiments of the present disclosure below. Obviously, the described embodiments are merely some but not all embodiments of the present disclosure. All other embodiments obtained by a person of ordinary skill in the art based on the embodiments of the present disclosure shall be included in the protection scope of the present disclosure.

A display apparatus may be used as a mobile phone, a tablet computer, a personal digital assistant (PDA), a vehicle-mounted computer, etc. The embodiments of the present disclosure do not particularly limit the specific use of the display apparatus.

Figure 1:
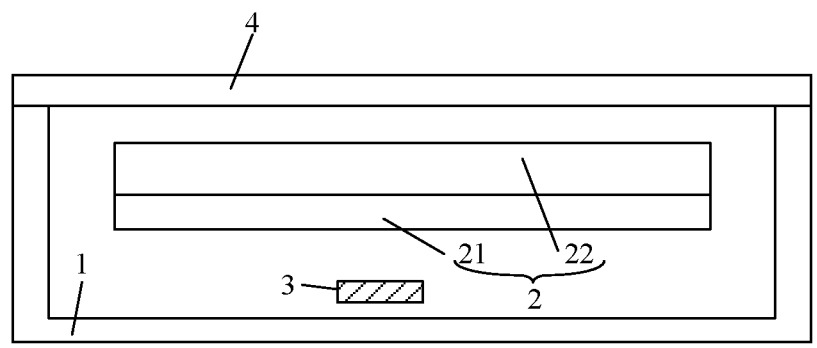
FIG. 1 is a schematic side view of a display apparatus, in accordance with embodiments of the present disclosure.

In some embodiments of the present disclosure, as shown in FIG. 1, the display apparatus includes a frame 1, a display panel 2, a circuit board 3, a cover plate 4, and other electronic accessories. The display panel 2 includes a display substrate 21 and an encapsulation layer 22.

The embodiments of the present disclosure provide a display substrate 21, and the display substrate 21 may be used as the display substrate 21 in the above display apparatus. Of course, the display substrate 21 may also be used in other display apparatuses, which is not particularly limited in the embodiments of the present disclosure.

Figure 2:
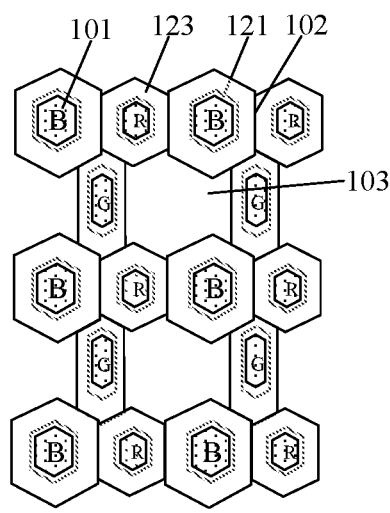
FIG. 2 is a schematic top view of a first electrode layer, in accordance with embodiments of the present disclosure.

As shown in FIG. 2, the display substrate 21 has sub-pixel regions 101 and a non-sub-pixel region 102 between or surrounding the sub-pixel regions 101. The display substrate 21 includes a light-emitting device layer, and the light-emitting device layer includes a first electrode layer. The first electrode layer includes a plurality of first electrodes 123 electrically connected to each other and hollowed-out region(s) 103 among part of adjacent first electrodes 123, and the hollowed-out region(s) 103 are located in the non-sub-pixel region 102.

Figure 3:
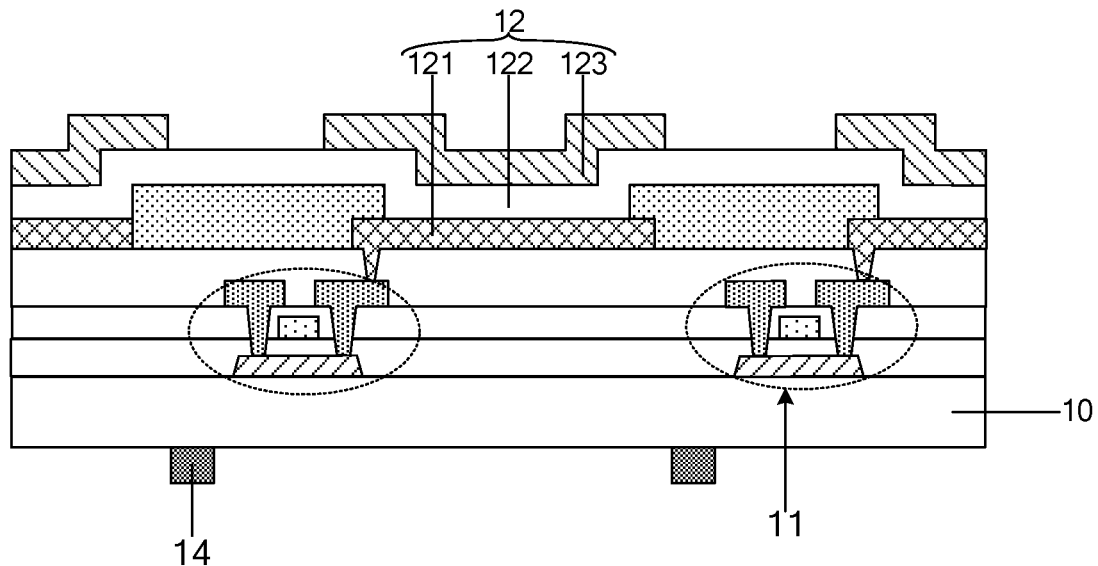
FIG. 3 is a schematic cross-sectional view of a display apparatus, in accordance with embodiments of the present disclosure.
Figure 4:
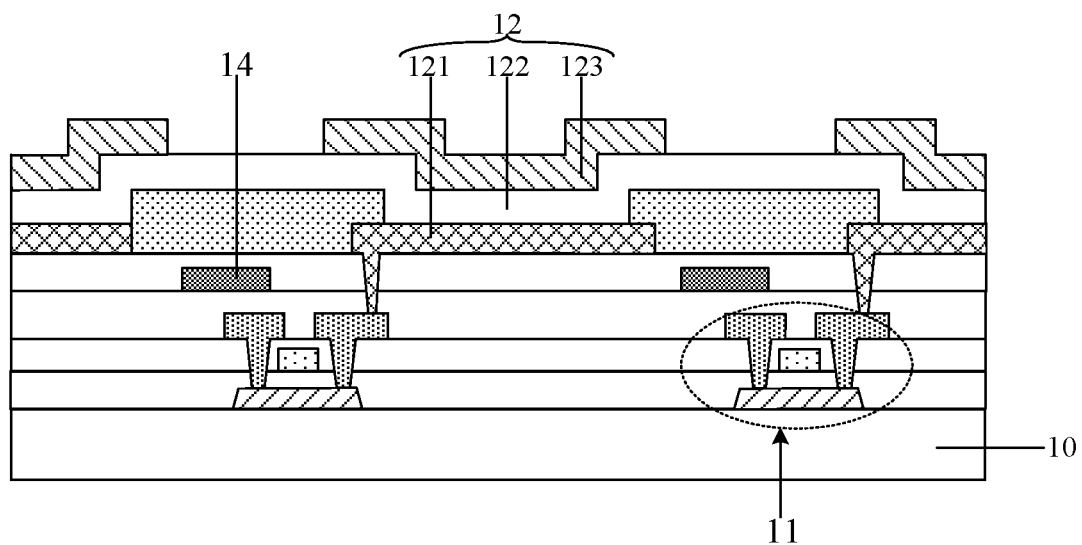
FIG. 4 is a schematic cross-sectional view of a display apparatus, in accordance with embodiments of the present disclosure.
Figure 5:
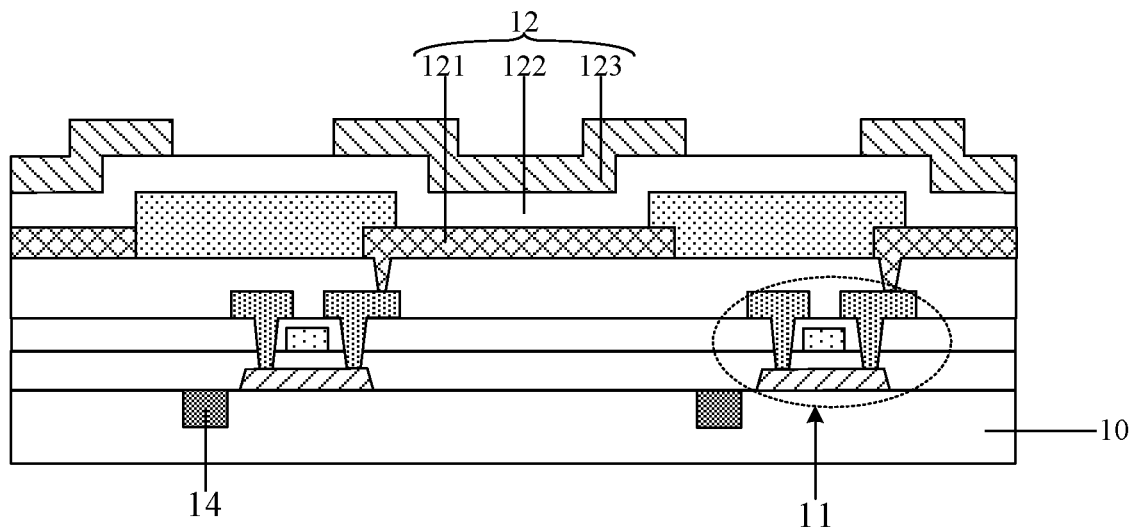
FIG. 5 is a schematic cross-sectional view of a display apparatus, in accordance with embodiments of the present disclosure.

In some embodiments, as shown in FIGS. 3 to 5, the display substrate 21 further includes a base 10 and thin film transistors 11 disposed on the base 10. The light-emitting device layer 12 is disposed on a side of the thin film transistors 11 away from the base 10.

In some embodiments, as shown in FIGS. 3 to 5, the display panel 2 including the display substrate 21 may be, for example, an organic light-emitting diode (OLED) display panel, or a quantum dot light-emitting diodes (QLED) display panel.

In some embodiments, the light-emitting device layer 12 includes a light-emitting functional layer 122. If the display panel 2 is an OLED display panel, the light-emitting functional layer 122 is an organic light-emitting functional layer. If the display panel 2 is a QLED display panel, the light-emitting functional layer 122 is a quantum dot light-emitting functional layer.

In some embodiments, the first electrode 123 is a cathode, that is, the light-emitting device layer 12 is a common cathode; or, the first electrode 123 is an anode, that is, the light-emitting device layer 12 is a common anode.

In some embodiments, considering the OLED display panel as an example, the display panel 2 may be, for example, any one of a top-emission display panel or a bottom-emission display panel. FIGS. 3 to 5 only show the top-emission display panels.

In some embodiments, the first electrode 123 may cover one sub-pixel region 101 or a plurality of sub-pixel regions 101.

In some embodiments, the sub-pixel region 101 may have any shape in accordance with actual requirements.

Figure 10:
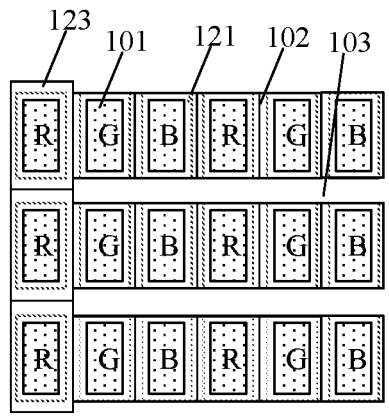
FIG. 10 is a schematic top view of a first electrode layer, in accordance with embodiments of the present disclosure.

For example, as shown in FIG. 2, the shape of the sub-pixel region 101 is a hexagon. As shown in FIG. 10, the shape of the sub-pixel region 101 is a rectangle.

In some embodiments, the first electrodes 123 are in one-to-one correspondence with the sub-pixel regions 101. The shape of the first electrode 123 and the shape of the corresponding sub-pixel region 101 may be the same or different, as long as the first electrode 123 completely covers the corresponding sub-pixel region 101.

For example, as shown in FIG. 2, the shapes of the first electrode 123 and the corresponding sub-pixel region 101 are both hexagons.

In some embodiments, the display substrate 21 has an active area, and the non-sub-pixel region 102 is the region in the active area other than the sub-pixel regions 101.

In some embodiments, all the first electrodes 123 are electrically connected, and there is a hollowed-out region 103 among part of the adjacent first electrodes 123. That is, except the adjacent first electrodes 123 used for forming the hollowed-out region 103, there is no hollowed-out region 103 among other adjacent first electrodes 123. That is, the other adjacent first electrodes 123 are in direct contact with each other.

In some embodiments, a size of the first electrode 123 is not limited, as long as all the first electrodes 123 are electrically connected, and there is a hollowed-out region 103 among part of adjacent first electrodes 123.

Figure 6:
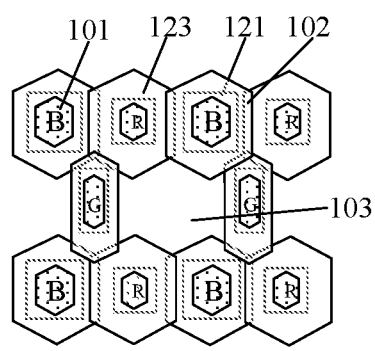
FIG. 6 is a schematic top view of a first electrode layer, in accordance with embodiments of the present disclosure.

In some embodiments, as shown in FIG. 2, there is no overlap between orthogonal projections of adjacent and directly contacting first electrodes 123 on the base 10; or, as shown in FIG. 6, there is a partial overlap between the orthogonal projections of the adjacent and directly contacting first electrodes 123 on the base 10.

In some embodiments, as shown in FIG. 6, an overlapping portion of the orthogonal projections of the adjacent and directly contacting first electrodes 123 on the base 10 is located in a non-sub-pixel region 102.

The embodiments of the present disclosure provide a display substrate 21 which includes a light-emitting device layer 12. The light-emitting device layer 12 includes a first electrode layer, and the first electrode layer includes a plurality of first electrodes 123 that are electrically connected. There are hollowed-out region(s) 103 among part of the adjacent first electrodes 123, and the hollowed-out region(s) 103 are located in the non-sub-pixel region 102. In this way, light transmittance of the hollowed-out region(s) 103 in the display substrate 21 may be greatly improved. In a case where the display substrate 21 is applied to a display apparatus, a collection portion 14 for receiving light signals may be disposed on a side away from a light-emitting side of the light-emitting device layer 12, so that the display apparatus may achieve more functions.

In some embodiments, the light-emitting device layer 12 further includes a second electrode layer stacked with the first electrode layer, and the second electrode layer includes a plurality of second electrodes 121 spaced apart from each other. A region among at least part of adjacent second electrodes 121 overlaps with the hollowed-out region(s) 103.

In some embodiments, in the case where the first electrode 123 is the cathode, the second electrode 121 is the anode; and in the case where the first electrode 123 is the anode, the second electrode 121 is the cathode.

In some embodiments, the second electrodes 121 are in one-to-one correspondence with the sub-pixel regions 101. In a case where the first electrodes 123 are also in one-to-one correspondence with the sub-pixel regions 101, a shape and a size of a second electrode 121 may be the same as or different from the shape and the size of a first electrode 123.

In some embodiments, the second electrode 121 just covers the sub-pixel region 101 corresponding to the second electrode; or, as shown in FIG. 2, the second electrode 121 is located in the sub-pixel region 101 corresponding to the second electrode, and an edge of the second electrode 121 extends beyond an edge of the sub-pixel region 101 corresponding to the sub-pixel region 101.

In the embodiments of the present disclosure, by overlapping the region among at least part of the adjacent second electrodes 121 with the hollowed-out region(s) 103, the collection portion 14 that receives the light signals may be arranged in an overlapping region between the region among the adjacent second electrodes 121 and the hollowed-out region(s) 103, so that any position of the collection portion 14 may receive the light signals, which improves a detection efficiency of the collection portion 14.

Figure 7:
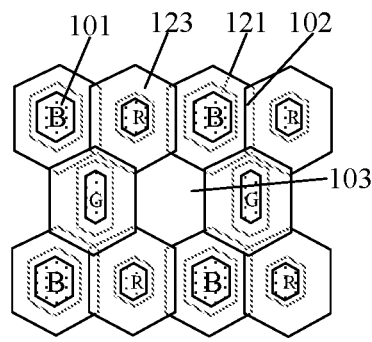
FIG. 7 is a schematic top view of a first electrode layer, in accordance with embodiments of the present disclosure.

In some embodiments, as shown in FIGS. 2, 6 and 7, the first electrodes 123 are in one-to-one correspondence with the sub-pixel regions 101. The plurality of sub-pixel regions 101 include a plurality of rows of sub-pixel regions 101, and the plurality of rows of sub-pixel regions 101 include a plurality of first color sub-pixel regions, a plurality of second color sub-pixel regions, and a plurality of third color sub-pixel regions. Each row of sub-pixel regions in odd-numbered (or even-numbered) rows of sub-pixel regions includes first color sub-pixel regions and second color sub-pixel regions, and each row of sub-pixel regions in even-numbered (or odd-numbered rows) of sub-pixel regions includes third color sub-pixel regions. First electrodes 123 corresponding to the third color sub-pixel regions in each row of sub-pixel regions in the even-numbered (or odd-numbered) rows of sub-pixel regions are arranged alternately with hollowed-out regions 103 along a row direction. According to some examples, along the row direction, the third color sub-pixel regions are staggered from the first color sub-pixel regions and the second color sub-pixel regions, and the first electrodes 123 corresponding to the third color sub-pixel regions are staggered from the first electrodes 123 corresponding to the first color sub-pixel regions and the first electrodes 123 corresponding to the second color sub-pixel regions. In each row of sub-pixel regions in odd-numbered (or even-numbered) rows of sub-pixel regions, adjacent first electrodes 123 in the first electrodes 123 corresponding to the first color sub-pixel regions and the first electrodes 123 corresponding to the second color sub-pixel regions are in direct contact, and are directly connected to the first electrodes 123 that are corresponding to the third color sub-pixel regions, located between the adjacent first electrodes 123 in the row direction, and adjacent to the adjacent first electrodes 123 in a column direction.

In some embodiments, as shown in FIGS. 2, 6 and 7, the first electrodes 123 are in one-to-one correspondence with the sub-pixel regions 101. The plurality of sub-pixel regions 101 include a plurality of first color sub-pixel regions, a plurality of second color sub-pixel regions, and a plurality of third color sub-pixel regions. The first color sub-pixel regions and the second color sub-pixel regions are located in a same row and arranged alternately, and the third color sub-pixel regions are located in a row adjacent to the first color sub-pixel regions. In the row direction, the third color sub-pixel regions are staggered from the first color sub-pixel regions and the second color sub-pixel regions. In the row direction, a first electrode 123 corresponding to a first color sub-pixel region is in direct contact with a first electrode 123 corresponding to a second color sub-pixel region. In the column direction, a first electrode 123 corresponding to a third color sub-pixel region is in direct contact with first electrodes 123 staggered therefrom and corresponding to a first color sub-pixel region and a second color sub-pixel region. A hollowed-out region 103 is located between adjacent first electrodes 123 arranged in the row direction and corresponding to the third color sub-pixel regions.

That is, the hollowed-out region 103 is surrounded by the first electrodes 123 corresponding to the adjacent third color sub-pixel regions and the first electrodes 123 corresponding to the first color sub-pixel regions and/or the second color sub-pixel regions located between the adjacent third color sub-pixel regions.

In some embodiments, the display substrate 21 has a plurality of rows of sub-pixel regions 101.

For example, the first color sub-pixel regions and the second color sub-pixel regions are located in odd-numbered rows, and the third color sub-pixel regions are located in even-numbered rows; or, the first color sub-pixel regions and the second color sub-pixel regions are located in even-numbered rows, and the third color sub-pixel regions are located in odd-numbered rows.

In some embodiments, the first color sub-pixel region, the second color sub-pixel region, and the third color sub-pixel region may be a red sub-pixel region, a green sub-pixel region, and a blue sub-pixel region; or, the first color sub-pixel region, the second color sub-pixel region, and the third color sub-pixel region may be a cyan sub-pixel region, a yellow sub-pixel region, and a magenta sub-pixel region.

In the embodiments of the present disclosure, according to one aspect, the number of first electrodes 123 in the row where the third color sub-pixel regions are located is half of the number of first electrodes 123 in the row where the first color sub-pixel regions and the second color sub-pixel regions are located. Therefore, by arranging a hollowed-out region 103 between the first electrodes 123 corresponding to the adjacent third color sub-pixel regions, an area of the hollowed-out region 103 may be maximized, which results in an increase of the intensity of the light irradiated on the collection portion 14. According to another aspect, the hollowed-out region 103 is located between the adjacent first electrodes 123 corresponding to the third color sub-pixel regions, that is, the first electrode 123 corresponding to the first color sub-pixel region and the first electrode 123 corresponding to the second color sub-pixel region, the first electrode 123 corresponding to the first color sub-pixel region and the first electrode 123 corresponding to the third color sub-pixel region, and the first electrode 123 corresponding to the second color sub-pixel region and the first electrode 123 corresponding to the third color sub-pixel region are all in direct contact. Compared to a situation that part of the adjacent first electrodes 123 in the first electrode layer are in direct contact and another part of the adjacent first electrodes 123 are not in direct contact, the embodiments of the present disclosure may resolve a problem of IR drop caused by different voltages on the plurality of first electrodes 123.

In some embodiments, as shown in FIGS. 2 and 6, the first color sub-pixel region is the blue sub-pixel region, the second color sub-pixel region is the red sub-pixel region, and the third color sub-pixel region is the green sub-pixel region.

In the embodiments of the present disclosure, since the human eyes are most sensitive to green light, the green sub-pixel regions may be sparsely arranged, so that the white light seen by the human eyes is displayed more uniform in a case where the display apparatus displays white light.

In some embodiments, as shown in FIG. 6, a shape and an area of the first electrode 123 corresponding to the first color sub-pixel region are the same as a shape and an area of the first electrode 123 corresponding to the second color sub-pixel region.

In some embodiments, the first electrode layer is formed by evaporation via a mask. The mask includes one or more of a first sub-mask, a second sub-mask, a third sub-mask, and a fourth sub-mask.

In some embodiments, the first electrode layer is formed by evaporation. An opening region of the mask corresponds to a region in which the first electrode layer is located.

In some embodiments, the manufacturing process of the first electrode layer in the embodiments of the present disclosure includes the following cases.

Figure 8:
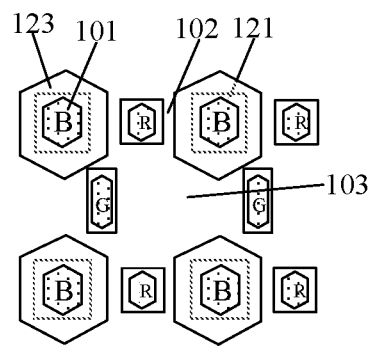
FIG. 8 is a manufacturing process diagram of a first electrode layer, in accordance with embodiments of the present disclosure.
Figure 9:
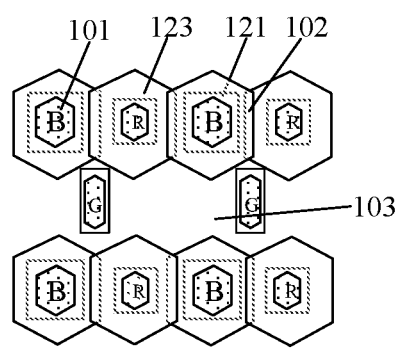
FIG. 9 is a manufacturing process diagram of a first electrode layer, in accordance with embodiments of the present disclosure.

In the first case, as shown in FIG. 8, the first electrodes 123 corresponding to the blue sub-pixel regions are formed firstly by the first sub-mask of the mask. As shown in FIG. 9, the first electrodes 123 corresponding to the red sub-pixel regions are formed then by the first sub-mask. As shown in FIG. 6, the first electrodes 123 corresponding to the green sub-pixel regions are formed finally by the fourth sub-mask of the mask.

In the second case, the first electrodes 123 corresponding to the red sub-pixel regions are formed firstly by the first sub-mask, the first electrodes 123 corresponding to the blue sub-pixel regions are formed then by the first sub-mask, and the first electrodes 123 corresponding to the green sub-pixel regions are formed finally by the fourth sub-mask.

In the third case, the first electrodes 123 corresponding to the green sub-pixel regions are formed firstly by the fourth sub-mask, the first electrodes 123 corresponding to the blue sub-pixel regions are formed then by the first sub-mask, the first electrodes 123 corresponding to the red sub-pixel regions are formed finally by the first sub-mask.

In the fourth case, the first electrodes 123 corresponding to the green sub-pixel regions are formed firstly by the fourth sub-mask; the first electrodes 123 corresponding to the red sub-pixel regions are formed then by the first sub-mask, and the first electrodes 123 corresponding to the blue sub-pixel regions are formed finally by the first sub-mask.

In the embodiments of the present disclosure, a pattern of the first sub-mask and a pattern of the fourth sub-mask may be the same or different.

In the embodiments of the present disclosure, compared to a situation that the shapes and areas of the first electrodes 123 corresponding to the first color sub-pixel region, the second color sub-pixel region, and the third color sub-pixel region are all different, the embodiments of the present disclosure make it possible to form the first electrode 123 corresponding to the first color sub-pixel region and the first electrode 123 corresponding to the second color sub-pixel region all through the first sub-mask, thereby saving one mask and reducing the manufacturing cost of the first electrode layer.

In some embodiments, as shown in FIG. 7, the shape and area of the first electrode 123 corresponding to the third color sub-pixel region are the same as the shape and area of the first electrode 123 corresponding to the first color sub-pixel region.

In the embodiments of the present disclosure, compared to the situation that the shapes and areas of the first electrodes 123 corresponding to the first color sub-pixel region, the second color sub-pixel region, and the third color sub-pixel region are all different, the embodiments of the present disclosure make it possible to form the first electrodes 123 corresponding to the first color sub-pixel region, the second color sub-pixel region and the third color sub-pixel region through a same mask, thereby saving two masks and reducing the manufacturing cost of the first electrode layer.

Figure 11:
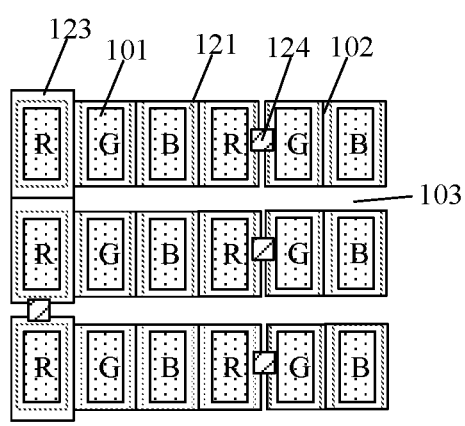
FIG. 11 is a schematic top view of a first electrode layer, in accordance with embodiments of the present disclosure.

In some embodiments, as shown in FIGS. 10 and 11, the plurality of sub-pixel regions 101 are arranged in an array.

In some embodiments, the arrangement of the first electrodes 123 that are corresponding to the plurality of sub-pixel regions 101 arranged in the array is not limited.

For example, as shown in FIGS. 10 and 11, there are M columns of sub-pixel regions 101. In a row direction, at least part of adjacent first electrodes 123 are in direct contact. In a column direction, at least part of adjacent first electrodes 123 in the X-th column are in direct contact. X is greater than or equal to 1, and less than or equal to M ($1 \leq X \leq M$), and X and M are both positive integers.

In some embodiments, in the case where the display substrate 21 is applied to a display apparatus, the display apparatus further includes a pixel circuit electrically connected to the light-emitting device layer 12, and the pixel circuit includes a gate line. The row direction may be the same direction as an extension direction of the gate line, or may be a direction perpendicular to the extension direction of the gate line.

In some embodiments, as shown in FIG. 10, in the row direction, all adjacent first electrodes 123 located in the same row are in direct contact. In the column direction, all adjacent first electrodes 123 located in the first column are in direct contact.

Alternatively, as shown in FIG. 11, part of the adjacent first electrodes 123 located in the same row are in direct contact, and another part of the adjacent first electrodes 123 are electrically connected through a conductive structure 124. In the column direction, part of the adjacent first electrodes 123 located in the X-th column are in direct contact, and another part of the adjacent first electrodes 123 are electrically connected through the conductive structure 124.

In some embodiments, the first electrode layer is formed by evaporation. An opening region of the mask corresponds to a region in which the first electrode layer is located.

In some embodiments, the manufacturing process of the first electrode layer in the embodiments of the present disclosure includes the following cases.

In the first case, the first electrodes 123 corresponding to the X-th column of sub-pixel regions are formed firstly by the second sub-mask of the mask, and the other first electrodes 123 are formed then by the third sub-mask of the mask. In the second case, the other first electrodes 123 are formed firstly by the third sub-mask of the mask, and the first electrodes 123 corresponding to the X-th column of sub-pixel regions are formed then by the second sub-mask of the mask.

In this way, adjacent portions of the first electrodes 123 formed through the second sub-mask and the first electrodes 123 formed through the third sub-mask may be not only in direct contact but also partially overlapped, so as to avoid insufficient electrical connection between the first electrodes 123 formed twice due to process errors.

Of course, the plurality of first electrodes 123 in the first electrode layer may also be electrically connected in other ways, which is not particularly limited in the embodiments of the present disclosure.

In some embodiments, as shown in FIGS. 6 and 7, at least part of adjacent first electrodes 123 overlap in the non-sub-pixel region 102.

In the embodiments of the present disclosure, according to one aspect, making the adjacent first electrodes 123 overlap in the non-sub-pixel region 102 may avoid a situation caused by the process errors. The situation is that the first electrodes 123 that should be directly contacted are not directly contacted, which leads to different voltages of all the first electrodes 123 in the first electrode layer and further affects the normal display of the display apparatus. According to another aspect, since the transmittance of the first electrode 123 is low, if the overlapping portion of the adjacent first electrodes 123 is located in the sub-pixel region 101, the brightness of the screen displayed by the display apparatus will be uneven. Therefore, by making the overlapping portion of the adjacent first electrodes 123 located in the non-sub-pixel region 102, it is possible to prevent the first electrodes 123 from affecting the display effect of the display apparatus.

In some embodiments, as shown in FIGS. 6 and 7, the first electrodes 123 are in one-to-one correspondence with the sub-pixel regions 101. The edge of the first electrode 123 extends beyond the edge of the sub-pixel region 101 corresponding to the first electrode, and distances from the edge of the first electrode 123 to the edge of the sub-pixel region 101 are equal everywhere.

In the embodiments of the present disclosure, in order to avoid a situation that part of the first electrodes 123 do not completely cover sub-pixel regions 101 corresponding to the first electrodes due to alignment errors during evaporation, the edge of the first electrode 123 corresponding to the sub-pixel region 101 may extend beyond the edge of the sub-pixel region 101, and the distances from the edge of the first electrode 123 to the edge of the sub-pixel region 101 are equal everywhere.

The embodiments of the present disclosure further provide a display apparatus including the display substrate 21 described in any of the foregoing embodiments. The display apparatus may further include a collection portion 14 disposed on the side away from the light-emitting side of the light-emitting device layer 12. An orthogonal projection of the collection portion 14 on a plane where the display substrate 21 is located is within an orthogonal projection of a hollowed-out region 103 between adjacent first electrodes 123 on the plane where the display substrate 21 is located, or an overlapping region of the orthogonal projection of the region between adjacent second electrodes 121 on the plane where the display substrate 21 is located and the orthogonal projection of the hollowed-out region 103 on the plane where the display substrate 21 is located, so that collection signals from the light-emitting side of the display apparatus is received.

In some embodiments, the specific arrangement position of the collection portion 14 is not limited, as long as the collection portion 14 is disposed on the side away from the light-emitting side of the light-emitting device layer 12. If the light-emitting device layer 12 is a top emission type, the collection portion 14 is disposed on a side of the light-emitting device layer 12 away from the encapsulation layer 22. If the light-emitting device layer 12 is a bottom emission type, the collection portion 14 is disposed on a side of the light-emitting device layer 12 away from the base 10. For example, the collection portion 14 may be disposed on the side of the encapsulation layer 22 away from the base 10.

In some embodiments, the display substrate 21 includes collection portions 14. Alternatively, the collection portions 14 may also be independently disposed on the circuit board 3, and the circuit board 3 is integrated in the display substrate 21.

For example, the display substrate 21 includes collection portions 14. As shown in FIG. 3, the collection portions 14 are disposed on the side of the base 10 away from the light-emitting device layer 12; or, as shown in FIG. 4, the collection portions 14 may also be disposed between the thin film transistors 11 and the light-emitting device layer 12; or, as shown in FIG. 5, the collection portions 14 may also be disposed between the base 10 and the thin film transistors 11.

Of course, the collection portions 14 may also be disposed at other positions in the display apparatus, which is not particularly limited in the embodiments of the present disclosure.

In some embodiments, in a case where the collection portions 14 are disposed on the side of the thin film transistors 11 away from the light-emitting device layer 12, the thin film transistors 11 are opaque. Therefore, in order to allow the collection portions 14 to receive collection signals, the collection signals cannot be blocked by the thin film transistors 11.

In some embodiments, in the case where the collection portions 14 are disposed on the side of the thin film transistors 11 away from the light-emitting device layer 12, there is no overlap between an orthogonal projection of a collection portion 14 on the base 10 and an orthogonal projection of a thin film transistor 11 on the base 10.

In some embodiments, the collection portions 14 are used for receiving the collection signals, and part of the collection portions 14 may also send out signals.

The specific structure of a collection portion 14 is not limited, and the collection portion 14 may have various functions.

For example, the collection portion 14 includes at least one of a camera, a fingerprint reader, and a vital-sign collector. Of course, the collection portion 14 may further include other function structures, which are not particularly limited in the embodiments of the present disclosure.

For example, the camera may be an infrared camera. Infrared light emitted by the infrared camera is irradiated on an object to be photographed, and after being reflected by the object to be photographed, is then reflected to a receiver of the infrared camera. The receiver processes light received by itself to generate a photographed picture.

The fingerprint reader may be, for example, an optical fingerprint reader. Display light of the display apparatus is irradiated on an object to be detected having wrinkles, such as fingers. After being reflected by the valley portion and ridge portion of the object to be detected, part of the display light is reflected to the optical fingerprint reader, and the optical fingerprint reader converts optical signals into electrical signals, and then obtains a texture image.

For example, the vital-sign collector may be an optical vital-sign collector. The heartbeat, hemoglobin content and the like may be detected according to the reflection of human skin to light.

In some embodiments, the collection signal may be, for example, an optical signal. The optical signal may be a visible light signal or a non-visible light signal.

With the popularity of smart phones and the acceleration of their update speed, consumers have put forward higher requirements for smart phones. At present, display screens of the smart phones gradually develop towards full-screen display. However, structures such as the camera, the fingerprint reader, and the vital-sign collector will affect the screen-to-body ratio of the smart phone.

In the related art, the camera or the like is usually disposed under the display panel 2 to achieve the effect of full-screen display. However, the cathode of the light-emitting device layer is usually a whole layer structure disposed in the active area, and a material of the cathode includes metal, and its light transmittance is very low. Only very small part of the light may pass through the cathode to be irradiated on the camera. The intensity of the light received by the camera is too low, which will affect the photographic effect.

However, the embodiments of the present disclosure provide a display apparatus. By arranging a collection portion 14 in the overlapping region between the region between adjacent second electrodes 121 and a hollowed-out region 103, in one aspect, the collection portion 14 may be prevented from affecting the normal display of the display panel 2; in another aspect, since the first electrode layer is hollowed out in a setting region of the collection portion 14, the light may be incident on the collection portion 14 without passing through the first electrode 123. Therefore, the intensity of the light incident on the collection portion 14 may also be increased, and the accuracy of the collection portion 14 may be improved.

The embodiments of the present disclosure further provide a method of manufacturing the display substrate 21. The display substrate 21 has a plurality of sub-pixel regions 101 and a non-sub-pixel region 102 located between adjacent sub-pixel regions 101.

The manufacturing method of the display substrate 21 includes: forming a first electrode layer on a base 10 by a mask. The first electrode layer includes a plurality of first electrodes 123 electrically connected to each other, and hollowed-out region(s) 103 among part of adjacent first electrodes 123. The hollowed-out region(s) 103 are located in the non-sub-pixel region 102.

In some embodiments, the first electrode 123 is a cathode, that is, the light-emitting device layer 12 is a common cathode; or, the first electrode 123 is an anode, that is, the light-emitting device layer 12 is a common anode.

In some embodiments, the first electrode 123 may cover one or more sub-pixel regions 101.

In some embodiments, the sub-pixel region 101 may have any shape in accordance with actual requirements. For example, as shown in FIG. 2, the shape of the sub-pixel region 101 is a hexagon. As shown in FIG. 10, the shape of the sub-pixel region 101 is a rectangle.

In some embodiments, the first electrodes 123 are in one-to-one correspondence with the sub-pixel regions 101. The shape of the first electrode 123 and the shape of the corresponding sub-pixel region 101 may be the same or different, as long as the first electrode 123 completely covers the corresponding sub-pixel region 101.

For example, as shown in FIG. 2, the shapes of the first electrode 123 and the corresponding sub-pixel region 101 are both hexagons.

In some embodiments, the display substrate 21 has an active area, and the non-sub-pixel region 102 is the regions in the active area other than the sub-pixel regions 101.

In some embodiments, all the first electrodes 123 are electrically connected, and there are hollowed-out region(s) 103 among part of the adjacent first electrodes 123. That is, except the adjacent first electrodes 123 used for forming the hollowed-out region(s) 103, there is no hollowed-out region 103 among other adjacent first electrodes 123. That is, the other adjacent first electrodes 123 are in direct contact with each other.

In some embodiments, the size of the first electrode 123 is not limited, as long as all the first electrodes 123 are electrically connected, and there is a hollowed-out region 103 among part of adjacent first electrodes 123.

In some embodiments, as shown in FIG. 2, there is no overlap between orthogonal projections of adjacent and directly contacting first electrodes 123 on the base 10; or, as shown in FIG. 6, there is a partial overlap between the orthogonal projections of the adjacent and directly contacting first electrodes 123 on the base 10.

In some embodiments, as shown in FIG. 6, an overlapping portion of the orthogonal projections of the adjacent and directly contacting first electrodes 123 on the base 10 is located in a non-sub-pixel region 102.

The embodiments of the present disclosure provide a method of manufacturing the display substrate 21. A first electrode layer is formed on the base 10 by the mask, and the first electrode layer includes a plurality of first electrodes 123 that are electrically connected. There is a hollowed-out region 103 among part of adjacent first electrodes 123, and the hollowed-out region 103 is located in a non-sub-pixel region 102. In this way, a light transmittance of the hollowed-out region 103 in the display substrate 21 may be greatly improved. In a case where the display substrate 21 is applied to a display apparatus, a collection portion 14 for receiving light signals may be disposed on a side away from a light-emitting side of the light-emitting device layer 12, so that the display apparatus may achieve more functions.

In some embodiments, as shown in FIGS. 2, 6 and 7, the first electrodes 123 are in one-to-one correspondence with the sub-pixel regions 101. The plurality of sub-pixel regions 101 include a plurality of rows of sub-pixel regions 101, and the plurality of rows of sub-pixel regions 101 include a plurality of first color sub-pixel regions, a plurality of second color sub-pixel regions, and a plurality of third color sub-pixel regions. Each odd-numbered (or even-numbered) row of sub-pixel regions includes first color sub-pixel regions and the second color sub-pixel regions, and each even-numbered (or odd-numbered) row of sub-pixel regions includes third color sub-pixel regions. First electrodes 123 corresponding to the third color sub-pixel regions in each even-numbered (or odd-numbered) row of sub-pixel regions are arranged alternately with the hollowed-out regions 103 along a row direction. According to some examples, in the row direction, the third color sub-pixel regions are staggered from the first color sub-pixel regions and the second color sub-pixel regions, and the first electrodes 123 corresponding to the third color sub-pixel regions are staggered from the first electrodes 123 corresponding to the first color sub-pixel region and the first electrodes 123 corresponding to the second color sub-pixel regions. In each odd-numbered (or even-numbered) row of sub-pixel regions, adjacent first electrodes 123 in the first electrodes 123 corresponding to the first color sub-pixel regions and the first electrodes 123 corresponding to the second color sub-pixel regions are in direct contact, and are directly connected to the first electrodes 123 that are corresponding to the third color sub-pixel regions, located between the adjacent first electrodes 123 in the row direction, and adjacent to the adjacent first electrodes 123 in a column direction.

In some embodiments, as shown in FIGS. 2, 6 and 7, the first electrodes 123 are in one-to-one correspondence with the sub-pixel regions 101. The plurality of sub-pixel regions 101 include a plurality of first color sub-pixel regions, a plurality of second color sub-pixel regions, and a plurality of third color sub-pixel regions. The first color sub-pixel regions and the second color sub-pixel regions are located in a same row and arranged alternately, and the third color sub-pixel regions are located in a row adjacent to the first color sub-pixel regions. In the row direction, the third color sub-pixel regions are staggered from the first color sub-pixel regions and the second color sub-pixel regions. In the row direction, a first electrode 123 corresponding to a first color sub-pixel region is in direct contact with a first electrode 123 corresponding to a second color sub-pixel region. In the column direction, a first electrode 123 corresponding to a third color sub-pixel region is in direct contact with first electrodes 123 staggered therefrom and corresponding to a first color sub-pixel region and a second color sub-pixel region. A hollowed-out region 103 is located between adjacent first electrodes 123 arranged in the row direction and corresponding to the third color sub-pixel regions.

That is, the hollowed-out region 103 is surrounded by the first electrodes 123 corresponding to the adjacent third color sub-pixel regions and the first electrodes 123 corresponding to the first color sub-pixel regions and/or the second color sub-pixel regions located between the adjacent third color sub-pixel regions.

In some embodiments, the display substrate 21 has a plurality of rows of sub-pixel regions 101.

For example, the first color sub-pixel regions and the second color sub-pixel regions are located in odd-numbered rows, and the third color sub-pixel regions are located in even-numbered rows; or, the first color sub-pixel regions and the second color sub-pixel regions are located in even-numbered rows, and the third color sub-pixel regions are located in odd-numbered rows.

In some embodiments, the first color sub-pixel region, the second color sub-pixel region, and the third color sub-pixel region may be a red sub-pixel region, a green sub-pixel region, and a blue sub-pixel region; or, the first color sub-pixel region, the second color sub-pixel region, and the third color sub-pixel region may be a cyan sub-pixel region, a yellow sub-pixel region, and a magenta sub-pixel region.

In the embodiments of the present disclosure, according to one aspect, the number of first electrodes 123 in the row where the third color sub-pixel regions are located is half of the number of first electrodes 123 in the row where the first color sub-pixel regions and the second color sub-pixel regions are located. Therefore, by arranging a hollowed-out region 103 between the first electrodes 123 corresponding to the adjacent third color sub-pixel regions, an area of the hollowed-out region 103 may be maximized, which results in an increase of the intensity of the light irradiated on the collection portion 14. According to another aspect, the hollowed-out region 103 is located between the adjacent first electrodes 123 corresponding to the third color sub-pixel regions, that is, the first electrode 123 corresponding to the first color sub-pixel region and the first electrode 123 corresponding to the second color sub-pixel region, the first electrode 123 corresponding to the first color sub-pixel region and the first electrode 123 corresponding to the third color sub-pixel region, and the first electrode 123 corresponding to the second color sub-pixel region and the first electrode 123 corresponding to the third color sub-pixel region are all in direct contact. Compared to the situation that part of the adjacent first electrodes 123 in the first electrode layer are in direct contact, and another part of the adjacent first electrodes 123 are not in direct contact, the embodiments of the present disclosure may resolve a problem of IR drop caused by different voltages on the plurality of first electrodes 123.

In some embodiments, as shown in FIGS. 2 and 6, the first color sub-pixel region is the blue sub-pixel region, the second color sub-pixel region is the red sub-pixel region, and the third color sub-pixel region is the green sub-pixel region.

In the embodiments of the present disclosure, since the human eyes are most sensitive to green light, the green sub-pixel regions may be sparsely arranged, so that the white light seen by the human eyes is displayed more uniform in a case where the display apparatus displays white light.

In some embodiments, forming the first electrode layer by the mask includes: forming the first electrode 123 corresponding to the first color sub-pixel region and the first electrode 123 corresponding to the second color sub-pixel region by a first sub-mask of the mask.

In some embodiments, the first sub-mask includes a first opening region, and the first opening region is used for forming the first electrode 123 corresponding to the first color sub-pixel region and the first electrode 123 corresponding to the second color sub-pixel region.

In some embodiments, the manufacturing process of the first electrode layer in the embodiments of the present disclosure may include the following cases.

In the first case, as shown in FIG. 8, the first electrodes 123 corresponding to the blue sub-pixel regions are formed firstly by the first sub-mask of the mask. As shown in FIG. 9, the first electrodes 123 corresponding to the red sub-pixel regions are formed then by the first sub-mask. As shown in FIG. 6, the first electrodes 123 corresponding to the green sub-pixel regions are formed finally by the fourth sub-mask of the mask.

In the second case, the first electrodes 123 corresponding to the red sub-pixel regions are formed firstly by the first sub-mask, the first electrodes 123 corresponding to the blue sub-pixel regions are formed then by the first sub-mask, and the first electrodes 123 corresponding to the green sub-pixel regions are formed finally by the fourth sub-mask.

In the third case, the first electrodes 123 corresponding to the green sub-pixel regions are formed firstly by the fourth sub-mask, the first electrodes 123 corresponding to the blue sub-pixel regions are formed then by the first sub-mask, the first electrodes 123 corresponding to the red sub-pixel regions are formed finally by the first sub-mask.

In the fourth case, the first electrodes 123 corresponding to the green sub-pixel regions are formed firstly by the fourth sub-mask; the first electrodes 123 corresponding to the red sub-pixel regions are formed then by the first sub-mask, and the first electrodes 123 corresponding to the blue sub-pixel regions are formed finally by the first sub-mask.

In the embodiments of the present disclosure, a pattern of the first sub-mask and a pattern of the fourth sub-mask may be the same or different.

In the embodiments of the present disclosure, compared to a situation that the shapes and areas of the first electrodes 123 corresponding to the first color sub-pixel region, the second color sub-pixel region, and the third color sub-pixel region are all different, the embodiments of the present disclosure make it possible to form the first electrode 123 corresponding to the first color sub-pixel region and the first electrode 123 corresponding to the second color sub-pixel region all through the first sub-mask, thereby saving one mask and reducing the manufacturing cost of the first electrode layer.

In some embodiments, as shown in FIG. 7, forming the first electrode layer further by the mask includes: forming the first electrode 123 corresponding to the third color sub-pixel region by the first sub-mask.

In the embodiments of the present disclosure, compared to the situation that the shapes and areas of the first electrodes 123 corresponding to the first color sub-pixel region, the second color sub-pixel region, and the third color sub-pixel region are all different, the embodiments of the present disclosure make it possible to form the first electrodes 123 corresponding to the first color sub-pixel region, the second color sub-pixel region and the third color sub-pixel region through a same mask, thereby saving two masks and reducing the manufacturing cost of the first electrode layer.

In some embodiments, as shown in FIGS. 10 and 11, the plurality of sub-pixel regions 101 are arranged in an array.

In some embodiments, the arrangement manner of the first electrodes 123 that are corresponding to the plurality of sub-pixel regions 101 arranged in the array is not limited.

In some embodiments, the first electrodes 123 are in one-to-one correspondence with the sub-pixel regions 101. There are M columns of sub-pixel regions 101. Forming the first electrode layer on the base 10 by the mask includes: in the column direction, forming first electrodes 123 corresponding to the X-th column of sub-pixel regions by a second sub-mask of the mask; and in the row direction, forming other first electrodes 123 by a third sub-mask of the mask. In the row direction, at least part of adjacent first electrodes 123 are in direct contact; and in the column direction, at least part of adjacent first electrodes 123 located in the X-th column are in direct contact. X is greater than or equal to 1, and less than or equal to M (1≤X≤M), and X and M are both positive integers.

In some embodiments, in the case where the display substrate 21 is applied to a display apparatus, the display apparatus further includes a pixel circuit electrically connected to the light-emitting device layer 12, and the pixel circuit includes a gate line. The row direction may be the same direction as an extension direction of the gate line, or may be a direction perpendicular to the extension direction of the gate line.

In some embodiments, as shown in FIG. 10, in the row direction, all adjacent first electrodes 123 located in the same row are in direct contact. In the column direction, all adjacent first electrodes 123 located in the X-th column are in direct contact.

Alternatively, as shown in FIG. 11, part of the adjacent first electrodes 123 located in the same row are in direct contact, and another part of the adjacent first electrodes 123 are electrically connected through a conductive structure 124. In the column direction, part of the adjacent first electrodes 123 located in the X-th column are in direct contact, and another part of the adjacent first electrodes 123 are electrically connected through the conductive structure 124.

In some embodiments, the first electrode layer is formed by evaporation. An opening region of the mask corresponds to a region in which the first electrode layer is located.

In some embodiments, the manufacturing process of the first electrode layer in the embodiments of the present disclosure includes the following cases.

In the first case, the first electrodes 123 corresponding to the X-th column of sub-pixel regions are formed firstly by the second sub-mask of the mask, and the other first electrodes 123 are formed then by the third sub-mask of the mask. In the second case, the other first electrodes 123 are formed firstly by the third sub-mask of the mask, and the first electrodes 123 corresponding to the X-th column of sub-pixel regions are formed then by the second sub-mask of the mask.

In this way, adjacent portions of the first electrodes 123 formed through the second sub-mask and the first electrodes 123 formed through the third sub-mask may be not only in direct contact but also partially overlapped, so as to avoid insufficient electrical connection between the first electrodes 123 formed twice due to process errors.

Of course, the plurality of first electrodes 123 in the first electrode layer may also be electrically connected in other ways, which is not particularly limited in the embodiments of the present disclosure.

The embodiments of the present disclosure further provide a mask for manufacturing the first electrode layer of the light-emitting device layer in the display substrate 21 described in any of the foregoing embodiments by evaporation.

The mask provided by the embodiments of the present disclosure is the same as the foregoing display substrate 21 in description and effect, which will not be repeated here.

The embodiments of the present disclosure provide a display substrate and a method of manufacturing the same, a display apparatus, and a mask. The light-emitting device layer includes a first electrode layer, and the first electrode layer includes a plurality of electrically connected first electrodes. There is a hollowed-out region among part of adjacent first electrodes, and the hollowed-out region is located in a non-sub-pixel region. In this way, the light transmittance of the portion of the light-emitting device layer located in the hollowed-out region may be greatly improved. In a case where the light-emitting device layer is applied to the display apparatus, a collection portion for receiving light signals may be disposed on the side away from the light-emitting side of the light-emitting device layer, so that the display apparatus may achieve more functions.

The forgoing descriptions are merely specific implementation manners of the present disclosure, but the protection scope of the present disclosure is not limited thereto. Any changes or replacements that a person skilled in the art could readily conceive of within the technical scope of the present disclosure shall be included in the protection scope of the present disclosure. Therefore, the protection scope of the present disclosure shall be subject to the protection scope of the claims.

What is claimed is:

1. A display substrate, having a plurality of sub-pixel regions used to display images and a non-sub-pixel region surrounding the sub-pixel regions; wherein the display substrate comprises a light-emitting device layer, the light-emitting device layer includes a first electrode layer; the first electrode layer includes a plurality of first electrodes electrically connected to each other and at least one hollowed-out region among part of adjacent first electrodes; and the at least one hollowed-out region is located in the non-sub-pixel region;

the plurality of sub-pixel regions include a plurality of rows of sub-pixel regions, the plurality of rows of sub-pixel regions include odd-numbered rows of sub-pixel regions and even-numbered rows of sub-pixel regions; and the plurality of rows of sub-pixel regions include a plurality of first color sub-pixel regions, a plurality of second color sub-pixel regions, and a plurality of third color sub-pixel regions; and each row of sub-pixel regions in the odd-numbered rows of sub-pixel regions includes first color sub-pixel regions and second color sub-pixel regions, each row of sub-pixel regions in the even-numbered rows of sub-pixel regions includes third color sub-pixel regions, and first electrodes corresponding to the third color sub-pixel regions in each row of sub-pixel regions in the even-numbered rows of the sub-pixel regions are arranged alternately with hollowed-out regions along a row direction; or, each row of sub-pixel regions in the even-numbered rows of sub-pixel regions includes the first color sub-pixel regions and the second color sub-pixel regions, each row of sub-pixel regions in the odd-numbered rows of sub-pixel regions includes the third color sub-pixel regions, and the first electrodes corresponding to the third color sub-pixel regions in each row of sub-pixel regions in the odd-numbered rows of the sub-pixel regions are arranged alternately with the hollowed-out regions along the row direction.

2. The display substrate according to claim 1, wherein the light-emitting device layer further includes a second electrode layer stacked with the first electrode layer, and the second electrode layer includes a plurality of second electrodes spaced apart from each other; and
a region among at least part of adjacent second electrodes overlaps with the at least one hollowed-out region.

3. The display substrate according to claim 1, wherein the plurality of first electrodes are in one-to-one correspondence with the plurality of sub-pixel regions;
along the row direction, the third color sub-pixel regions are staggered from the first color sub-pixel regions and the second color sub-pixel regions, and first electrodes corresponding to the third color sub-pixel regions are staggered from first electrodes corresponding to the first color sub-pixel regions and first electrodes corresponding to the second color sub-pixel regions; and
adjacent first electrodes in the first electrodes corresponding to the first color sub-pixel regions and the first electrodes corresponding to the second color sub-pixel regions in each row of sub-pixel regions in the odd-numbered rows of sub-pixel regions are in direct contact, and are directly connected to the first electrodes, which are corresponding to the third color sub-pixel regions, located between the adjacent first electrodes in the row direction and adjacent to the adjacent first electrodes in a column direction; or,
adjacent first electrodes in the first electrodes corresponding to the first color sub-pixel regions and the first electrodes corresponding to the second color sub-pixel regions in each row of sub-pixel regions in the even-numbered rows of sub-pixel regions are in direct contact, and are directly connected to the first electrodes, which are corresponding to the third color sub-pixel regions, located between the adjacent first electrodes in the row direction and adjacent to the adjacent first electrodes in a column direction.

4. The display substrate according to claim 1, wherein a first color sub-pixel region is a blue sub-pixel region, a second color sub-pixel region is a red sub-pixel region, and a third color sub-pixel region is a green sub-pixel region.

5. The display substrate according to claim 4, wherein a shape of a first electrode corresponding to a first color sub-pixel region is same as a shape of a first electrode corresponding to a second color sub-pixel region; and
an area of the first electrode corresponding to the first color sub-pixel region is same as an area of the first electrode corresponding to the second color sub-pixel region.

6. The display substrate according to claim 5, wherein a shape of a first electrode corresponding to a third color sub-pixel region is same as the shape of the first electrode corresponding to the first color sub-pixel region; and an area of the first electrode corresponding to the third color sub-pixel region is same as the area of the first electrode corresponding to the first color sub-pixel region.

7. The display substrate according to claim 1, wherein at least part of adjacent first electrodes overlap in the non-sub-pixel region.

8. The display substrate according to claim 1, wherein the plurality of first electrodes are in one-to-one correspondence with the plurality of sub-pixel regions; and
an edge of a first electrode extends beyond an edge of a sub-pixel region corresponding to the first electrode, and distances from the edge of the first electrode to the edge of the sub-pixel region are equal everywhere.

9. A mask, used to manufacture the first electrode layer in the display substrate according to claim 1 by evaporation.

10. A display apparatus, comprising: the display substrate according to claim 1.

11. The display apparatus according to claim 10, further comprising:
a collection portion disposed on a side away from a light-emitting side of the light-emitting device layer, wherein an orthogonal projection of the collection portion on a plane in which the display substrate is located is within an orthogonal projection of a hollowed-out region among adjacent first electrodes on the plane in which the display substrate is located.

12. The display apparatus according to claim 11, wherein the light-emitting device layer further includes a second electrode layer stacked with the first electrode layer, and the second electrode layer includes a plurality of second electrodes spaced apart from each other; and
a region among at least part of adjacent second electrodes overlaps with the at least one hollowed-out region; and
the orthogonal projection of the collection portion on the plane in which the display substrate is located is within an overlapping region between an orthogonal projection of the region among at least part of adjacent second electrodes on the plane in which the display substrate is located and an orthogonal projection of a hollowed-out region on the plane in which the display substrate is located, so as to receive a collection signal from a light-emitting side of the display apparatus.

13. The display apparatus according to claim 12, wherein the collection portion includes at least one of a camera, a fingerprint reader, or a vital-sign collector.

14. A method of manufacturing a display substrate, wherein the display substrate has a plurality of sub-pixel regions and a non-sub-pixel region surrounding the plurality of sub-pixel regions;
the plurality of sub-pixel regions include a plurality of rows of sub-pixel regions, the plurality of rows of sub-pixel regions include odd-numbered rows of sub-pixel regions and even-numbered rows of sub-pixel regions; and the plurality of rows of sub-pixel regions include a plurality of first color sub-pixel regions, a plurality of second color sub-pixel regions, and a plurality of third color sub-pixel regions; and
each row of sub-pixel regions in the odd-numbered rows of sub-pixel regions includes first color sub-pixel regions and second color sub-pixel regions, each row of sub-pixel regions in the even-numbered rows of sub-pixel regions includes third color sub-pixel regions, and first electrodes corresponding to the third color sub-pixel regions in each row of sub-pixel regions in the even-numbered rows of the sub-pixel regions are arranged alternately with hollowed-out regions along a row direction; or, each row of sub-pixel regions in the even-numbered rows of sub-pixel regions includes the first color sub-pixel regions and the second color sub-pixel regions, each row of sub-pixel regions in the odd-numbered rows of sub-pixel regions includes the third color sub-pixel regions, and the first electrodes corresponding to the third color sub-pixel regions in each row of sub-pixel regions in the odd-numbered rows of the sub-pixel regions are arranged alternately with the hollowed-out regions along the row direction, and, the method of manufacturing the display substrate comprises:

forming a first electrode layer on a base by a mask; wherein the first electrode layer includes a plurality of first electrodes electrically connected to each other and at least one hollowed-out region among part of adjacent first electrodes, and the at least one hollowed-out region is located in the non-sub-pixel region.

15. The method of manufacturing the display apparatus according to claim 14, wherein the plurality of first electrodes are in one-to-one correspondence with the plurality of sub-pixel regions;

the forming the first electrode layer by the mask includes:

forming the first electrodes corresponding to the first color sub-pixel regions and the first electrodes corresponding to the second color sub-pixel regions by a first sub-mask of the mask.

16. The method of manufacturing the display substrate according to claim 15, wherein the forming the first electrode layer by the mask further includes:

forming the first electrodes corresponding to the third color sub-pixel regions by the first sub-mask.

17. A display substrate, having a plurality of sub-pixel regions used to display images and a non-sub-pixel region surrounding the sub-pixel regions; wherein the display substrate comprises a light-emitting device layer, the light-emitting device layer includes a first electrode layer; the first electrode layer includes a plurality of first electrodes electrically connected to each other and at least one hollowed-out region among part of adjacent first electrodes; and the at least one hollowed-out region is located in the non-sub-pixel region;

the plurality of sub-pixel regions are arranged in an array;

the plurality of first electrodes are in one-to-one correspondence with the plurality of sub-pixel regions, and there are M columns of sub-pixel regions; and in a row direction, at least part of adjacent first electrodes are in direct contact; in a column direction, at least part of adjacent first electrodes in X-th column are in direct contact; X is greater than or equal to 1, and less than or equal to M, and X and M are both positive integers.

18. A method of manufacturing the display substrate according to claim 17, the method of manufacturing the display substrate comprises:

forming the first electrode layer on a base by a mask, wherein the forming the first electrode layer on the base by the mask includes:

in the column direction, forming first electrodes corresponding to the X-th column of sub-pixel regions by a second sub-mask of the mask; and in the row direction, forming other first electrodes by a third sub-mask of the mask.

* * * * *